United States Patent
Okamoto et al.

(10) Patent No.: US 7,100,682 B2
(45) Date of Patent: *Sep. 5, 2006

(54) COOLING DEVICE WITH WATER PROOF STRUCTURE

(75) Inventors: Yoshiyuki Okamoto, Nagoya (JP); Kiyoshi Kawaguchi, Toyota (JP); Koji Kishita, Motosu-gun (JP)

(73) Assignee: DENSO Corporation, Kariya (JP)

( * ) Notice: Subject to any disclaimer, the term of this patent is extended or adjusted under 35 U.S.C. 154(b) by 305 days.

This patent is subject to a terminal disclaimer.

(21) Appl. No.: 10/679,161

(22) Filed: Oct. 3, 2003

(65) Prior Publication Data

US 2004/0188073 A1    Sep. 30, 2004

Related U.S. Application Data

(62) Division of application No. 09/666,697, filed on Sep. 21, 2000, now Pat. No. 6,789,612.

(30) Foreign Application Priority Data

Sep. 29, 1999    (JP)    ................. 11-276764

(51) Int. Cl.
*F28D 9/02*    (2006.01)
*H05K 7/20*    (2006.01)
*F24F 1/02*    (2006.01)
*H02B 1/56*    (2006.01)

(52) U.S. Cl. .................. 165/104.34; 165/104.33; 165/166; 165/54; 165/134.1; 165/47

(58) Field of Classification Search .......... 165/104.33, 165/104.34, 166, 54, 134.1, 47
See application file for complete search history.

(56) References Cited

U.S. PATENT DOCUMENTS

| 3,559,728 | A | 2/1971 | Lyman |
| 4,386,651 | A | 6/1983 | Reinhard |
| 6,789,612 | B1 * | 9/2004 | Okamoto et al. ...... 165/104.34 |
| 6,889,752 | B1 * | 5/2005 | Stoller ..................... 165/47 |

FOREIGN PATENT DOCUMENTS

| DE | 19709145 C1 * | 9/1998 |
| JP | 59-157481 | 9/1984 |
| JP | B2-2-3320 | 1/1990 |
| JP | 2-7586 | 3/1990 |
| JP | 6-11292 | 1/1994 |

* cited by examiner

Primary Examiner—John K. Ford
(74) Attorney, Agent, or Firm—Harness, Dickey & Pierce, PLC

(57) ABSTRACT

A cooling device for cooling an inner part of an approximately sealed box includes a casing and a heat exchanger disposed in the casing. Plural inside air passages through which air inside the box flows and plural outside air passages through which air outside the box flows are alternately adjacently arranged in the heat exchanger. In the cooling device, both outside air introduction port and outside air discharge port are provided in an outer side plate of the casing, and a drain space is provided between the heat exchanger and the outer side plate of the casing so that outside air passages communicate with the outside air discharge port through the drain space. Thus, even when rain water is introduced into the casing from the outside air discharge port, almost rain water flows downwardly through the drain space, and it can restrict rain water from being introduced into the heat exchanger.

9 Claims, 11 Drawing Sheets

COOLING DEVICE WITH WATER PROOF STRUCTURE

CROSS-REFERENCE TO RELATED APPLICATION

This application is a divisional of U.S. patent application Ser. No. 09/666,697 filed on Sep. 21, 2000 now U.S. Pat. No. 6,789,612. This application is based upon and claims the benefit of priority of Japanese Patent Application No. Hei. 11-276764 filed on Sep. 29, 1999, the contents of which are incorporated herein by reference.

BACKGROUND OF THE INVENTION

1. Field of the Invention

The present invention generally relates to a cooling device for cooling an inner part of an approximately sealed box by a heat-exchange between air inside the box and air outside the box. Mare particularly, the present invention relates to a waterproof structure of a heat-exchanging device.

2. Description of Related Art

In a conventional cooling device for cooling a heat-generating member such as an electromagnetic member used within a sealed cabinet, a heat exchanger is disposed in the cabinet so that an inner part of the cabinet is cooled by performing a heat-exchange between air inside the cabinet and air outside the cabinet. However, because it is necessary to have a waterproof structure when the cabinet is disposed at an exterior space, an outer peripheral part of the heat exchanger is potted by a potting resin material so that a waterproof line is formed around the heat exchanger in the cooling device. Therefore, a potting process of resin material is necessary, and assembling steps of the cooling device become trouble. Further, when once the waterproof process is performed, it is difficult to remove the heat exchanger from a casing of the cooling unit, and maintenance performance of the heat exchanger is deteriorated.

SUMMARY OF THE INVENTION

In view of the foregoing problems, it is an object of the present invention to provide a heat-exchanging device that cools or heats an inner part of an approximately sealed box by a heat-exchange between air inside the box and air outside the box, while improving operation performance, waterproof performance and maintenance performance thereof.

According to the present invention, in a heat-exchanging device attached to a box to form an approximately sealed inner space within the box, a heat exchanger has therein a plurality of inside air passages through which inside air inside the box flows, and a plurality of outside air passages through which outside air outside the box flows. The inside air passages and the outside air passages are alternately adjacently arranged in the heat exchanger, and the heat exchanger is accommodated in a casing having an outer wall surface in which an outside air introduction port for introducing outside air into the outside air passages and an outside air discharge port for discharging outside air from the outside air passages are provided. In the heat-exchanging device, the heat exchanger is disposed in the casing to form a space having a predetermined distance between the heat exchanger and the outer wall surface, and the outside air passages are provided to communicate with the outside air discharge port through the space. Thus, even when rain water is introduced into the casing from the outside air discharge port, the rain water flows downwardly in the space between the heat exchanger and the outer wall surface of the casing, and therefore, it can prevent the rain water from being introduced into the heat exchanger.

Preferably, the casing has a drain passage communicating with the space, and the drain passage is provided at a position lower than a bottom surface of the heat exchanger. Therefore, rain water introduced into the space from the outside air discharge port can be readily discharged to a lower side of the heat exchanger.

The heat-exchanging device further includes a seal member through which a boundary part between the inside air passages and the outside air passages of the heat exchanger is water-tightly detachably attached to an attachment wall surface of the casing. Therefore, the heat exchanger can be readily detached from the casing after being assembled to the casing, and maintenance performance of the heat exchanger is improved. Further, because the boundary part of the heat exchanger is water-tightly attached to the attachment wall surface, seal performance of the heat-exchanging device between inside air side and outside air side can be improved.

More preferably, the inside air passages and the outside air passages are provided in such a manner that both the outermost air passages of the heat exchanger are two of the inside air passages. Therefore, wall parts defining the outermost inside air passages can be used as seal surfaces to be attached to the attachment wall surface of the casing through the seal member. Thus, waterproof performance of the heat-exchanging device can be further improved.

BRIEF DESCRIPTION OF THE DRAWINGS

Additional objects and advantages of the present invention will be more readily apparent from the following detailed description of preferred embodiments when taken together with the accompanying drawings, in which.

DETAILED DESCRIPTION OF THE PRESENTLY PREFERRED EMBODIMENTS

Preferred embodiments of the present invention will be described hereinafter with reference to the accompanying drawings.

Figure 1:
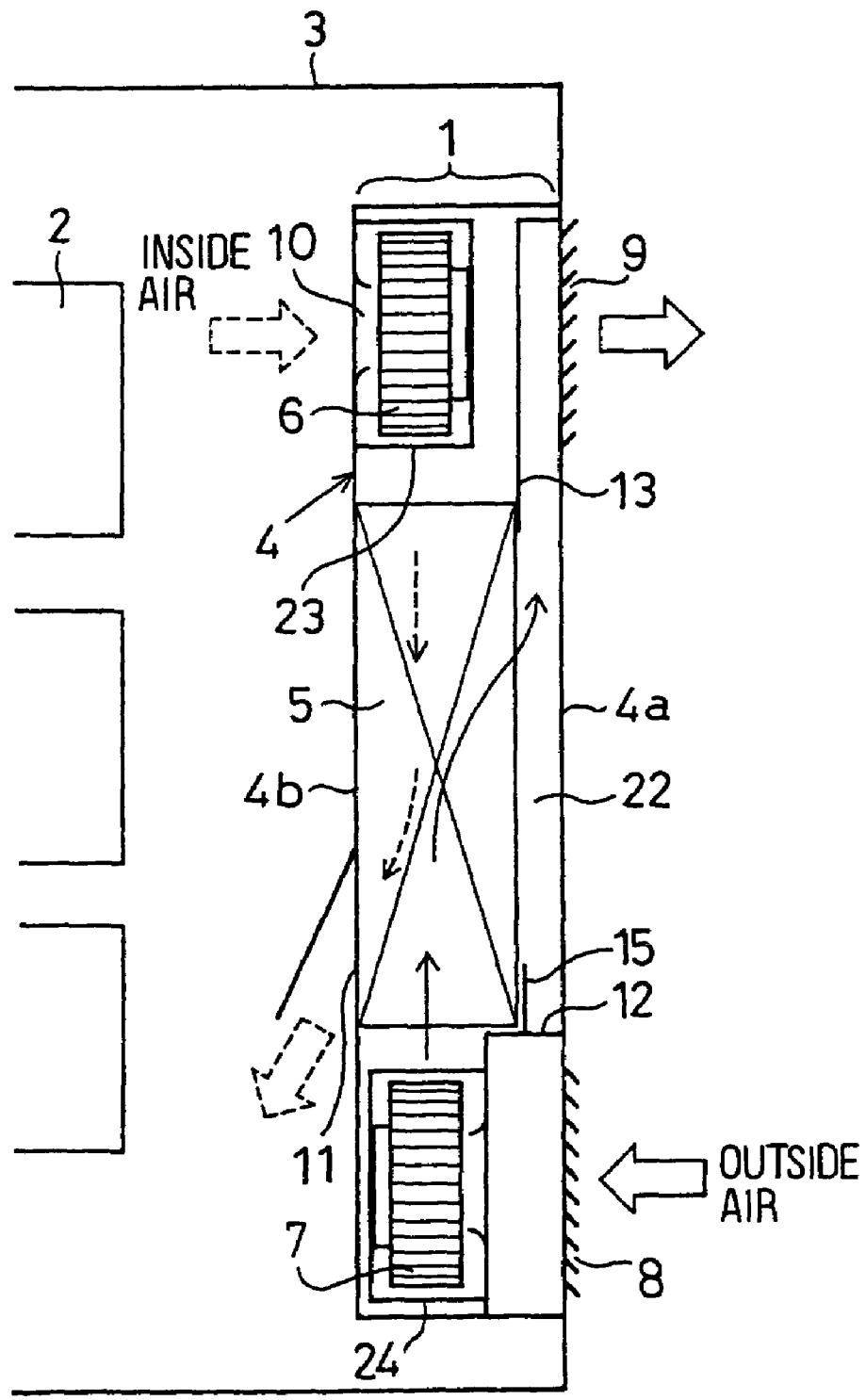
FIG. 1 is a side view showing an inner structure of a cooling device according to a first preferred embodiment of the present invention.

A first preferred embodiment will be now described. In the first embodiment, the present invention is typically applied to a cooling device 1. As shown in FIG. 1, the cooling device 1 is attached to a one side surface of a box (e.g., cabinet) 3 for accommodating a heat-generating member such as an electromagnetic member 2. The cooling device 1 is disposed to cool an inner part of the box 3 by performing a heat-exchange between inside air inside the box 3 and outside air outside the box 3. The box 3 defines an approximately sealed inner space when the cooling device 1 is attached to the box 3.

The cooling device 1 includes a casing 4, a heat exchanger 5, an inside air fan 6 and an outside air fan 7. The heat exchanger 5, the inside air fan 6 and the outside air fan 7 are disposed within the casing 4. The casing 4 has an outside side surface 4a in which an outside air introduction port 8 and an outside air discharge port 9 are formed, and an inside side surface 4b in which an inside air introduction port 10 and an inside air discharge port 11 are formed.

Figure 2:
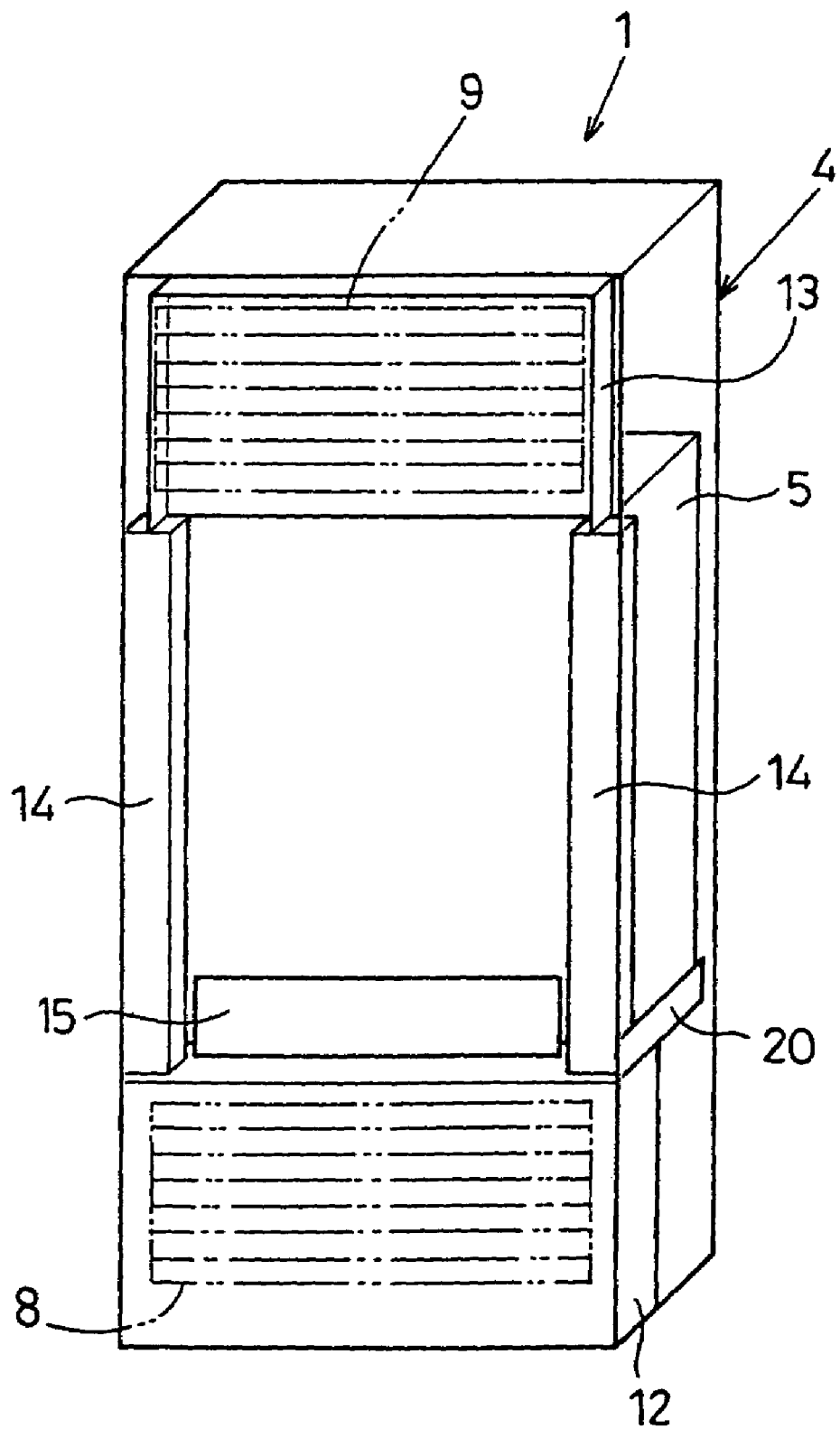
FIG. 2 is a perspective view of the cooling device according to the first embodiment.

As shown in FIGS. 1 and 2, the casing 4 further has therein a bracket 12 provided around the outside air introduction port 8, a partition wall 13 for partitioning an inside air side and an outside air side relative to the heat exchanger 5, two pillar portions 14 disposed between the partition wall 13 and the bracket 12 standingly at both right and left sides of the casing 4 in FIG. 2, and a waterproof plate 15 disposed standingly between both the pillar portions 14 on an upper surface of the bracket 12. The partition wall 13 and the waterproof plate 15 are disposed to form a clearance with the outside side surface 4a, and the clearance dimension is approximately equal to a thickness of the pillar portions 14.

Figure 3:
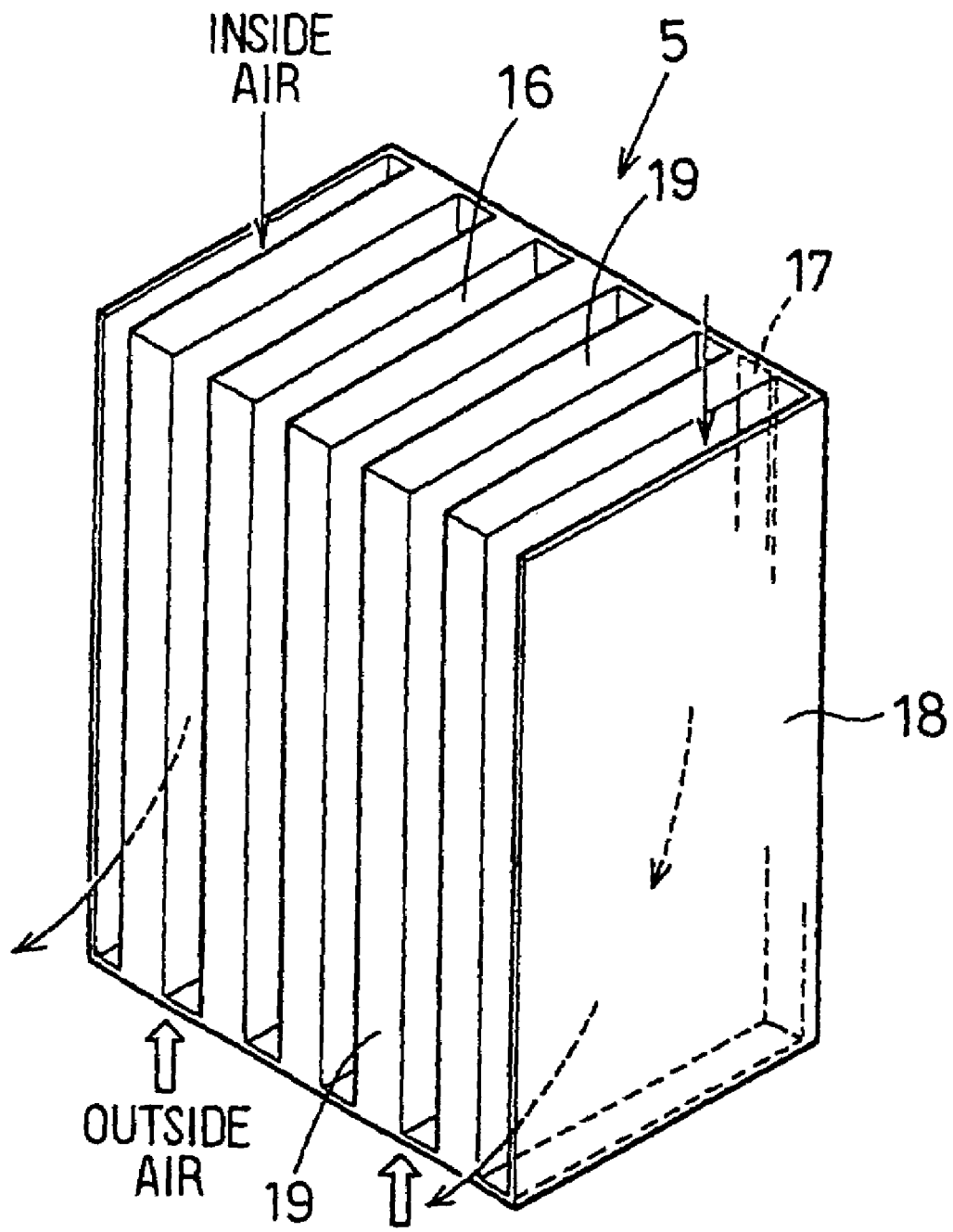
FIG. 3 is a perspective view of a heat exchanger of the cooling device according to the first embodiment.

As shown in FIG. 3, the heat exchanger 5 is formed into a rectangular parallelopiped shape. Within the heat exchanger 5, plural inside air passages 16 and plural outside air passages 17 are alternately adjacently arranged. Plural rectangular plane plates 18 are arranged in parallel with each other, and adjacent two of the plane plates 18 are disposed to be opposite from each other to have a predetermined clearance therebetween. Plural L-shape plates 19 are disposed in plural spaces defined by the plane plates 18, respectively, to form the inside air passages 16 and the outside air passages 17. Both the plates 19 defining adjacent both the inside air passage 16 and the outside air passage 17 are disposed diagonally when being viewed from an arrangement direction of the inside air passages 16 and the outside air passages 17. Therefore, as shown in FIG. 3, the inside air passages 16 are provided to be opened at the left and upper sides in FIG. 3, and the outside air passages 17 are provided to be opened at the right and lower sides in FIG. 3, respectively. Further, in the first embodiment, because both most right and left passages of the heat exchanger 5 are the inside air passages 16, the heat exchanger 5 can be fitted to the casing 4 by using the rear surfaces of the plates 19 defining the most right and left inside air passages 16.

Figure 4:
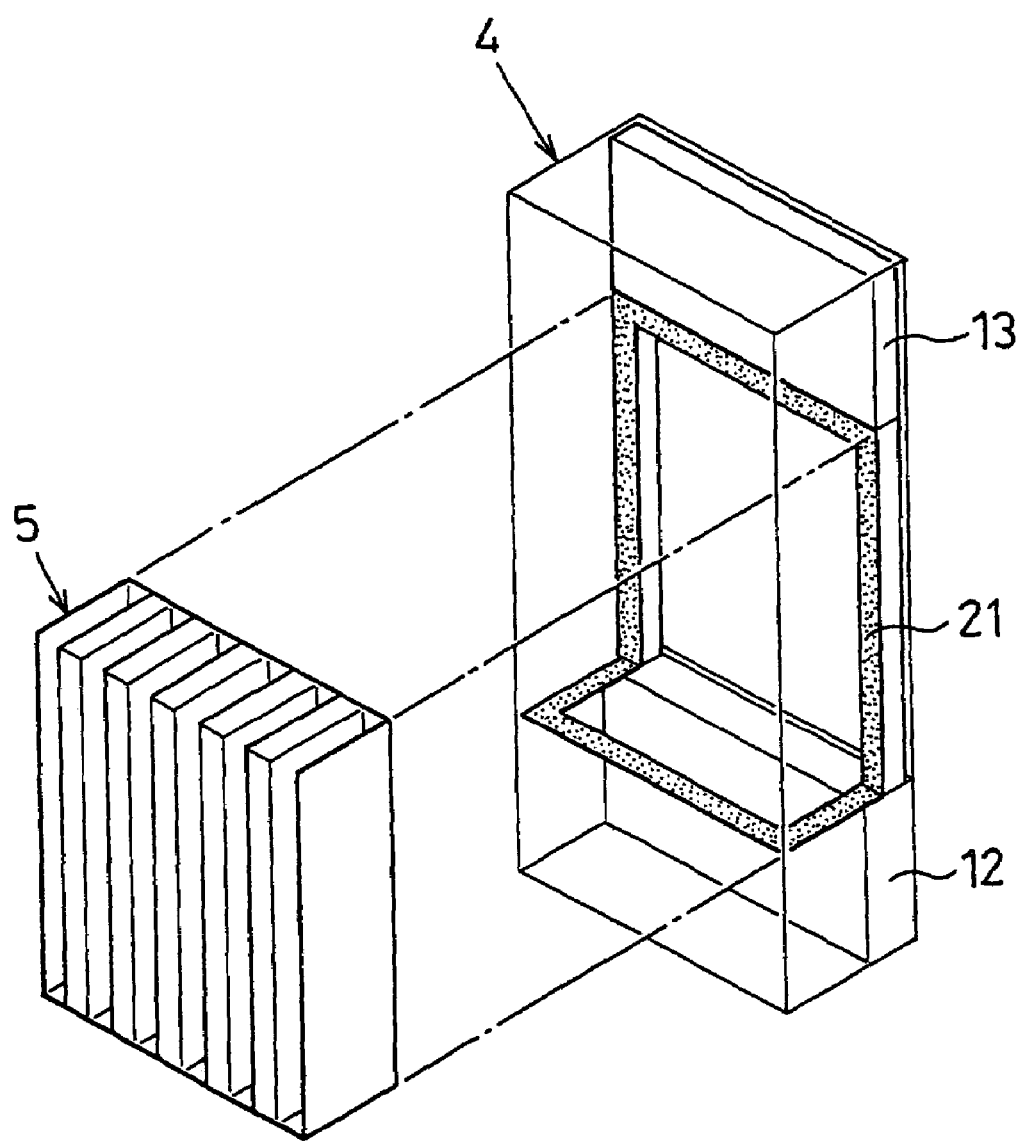
FIG. 4 is a perspective view showing a position relationship between the heat exchanger and a packing, according to the first embodiment.

The heat exchanger 5 is held in the casing 4 by stays 20 provided at both right and left sides on the bracket 12, and the like. Further, as shown in FIG. 4, flat rear surfaces of both the right and left plates 19 defining both the inside air passages 16 at both the most right and left sides of the heat exchanger 5 are pressed to flat surfaces of both the pillar parts 14 and the stays 20 of the casing 4 through a packing 21. The parking 21 is provided at a position facing the flat rear surfaces of the plates 19 defining both the right and left inside air passages 16 at both the most right and left sides of the heat exchanger 5, and is also provided at a position corresponding to a boundary part between an inside air side and an outside air side of the heat exchanger 5, so that the inside air side and the outside air side of the heat exchanger 5 are partitioned from each other.

Further, as shown in FIG. 1, the heat exchanger 5 is disposed to have a predetermined space (hereinafter, the space is referred to as "drain space 22") between the heat exchanger 5 and the outside side surface 4a of the casing 4. Accordingly, inlet openings of the outside air passages 17 of the heat exchanger 5 communicate with the outside air introduction port 8 through the outside air fan 7, and outlet openings thereof communicate with the outside discharge port 9 through the drain space 22. On the other hand, inlet openings of the inside air passages 16 communicate with the inside air introduction port 10 through the inside air fan 6, and outlet openings thereof communicate with the inside air discharge port 11.

The inside air fan 6 is disposed opposite to the inside air introduction port 10 provided at an upper side of the heat exchanger 5 so that inside air of the box 3 is blown into the inside air passages 16 of the heat exchanger 5 by the inside air fan 6. The inside air fan 6 is fixed to the casing 4 by a fan stay 23. The outside air fan 7 is disposed opposite to the outside air introduction port 8 provided at a lower side of the heat exchanger 5 so that outside air is blown into the outside air passages 17 of the heat exchanger 5 by the outside air fan 7. The outside air fan 7 is fixed to the bracket 12 by a fan stay 24.

Next, operation and effect of the cooling device 1 according to the first embodiment is described. Inside air inside the box 3 flows through the inside air passages 16 downwardly from top by a rotation of the inside air fan 6, and outside air outside the box 3 flows through the outside air passages 17 upwardly from below by a rotation of the outside air fan 7. Temperature of inside air of the box 3 is increased by heat generated from the heat-generating member 2 to be higher than that of outside air. Therefore, a heat-exchange between inside air and outside air is performed in the heat exchanger 5, and inside air is cooled by outside air in the heat exchanger 5.

Because the drain space 22 is provided between the heat exchanger 5 and the outside side surface 4a to which the outlet openings of the outside air passages 17 are opened, rain water introduced within the casing 4 from the outside air introduction port 8 or the outside air discharge port 9 can fall toward a lower side of the drain space 22 through the drain space 22. The rain water flowing downwardly in the drain space 22 is prevented from being introduced into an inner side of the heat exchanger 5 by the waterproof plate 15. For example, the rain water is discharged to an outside of the casing 4 through a drain hole 25 (see FIG. 5) provided in the upper surface of the bracket 12, or can be discharged to the outside of the casing 4 from the outside air introduction port 8 after flowing through a clearance between the waterproof plate 15 and the pillar portions 14.

Further, the boundary part between the inside air side and the outside air side of the heat exchange 5 is sealed by using the packing 21 provided on the flat surface of the casing 4

(i.e., both the pillar parts 14 and the stays 20). Therefore, it is unnecessary to apply a potting material such as resin to the boundary part. Accordingly, assembling steps of the cooling device 1 become simple, and waterproof performance is improved with a simple seal structure. Further, because the seal structure due to the packing 21 is used, the heat exchanger 5 can be readily detached from the casing 4, and maintenance performance of the heat exchanger 5 is improved.

Figure 5:
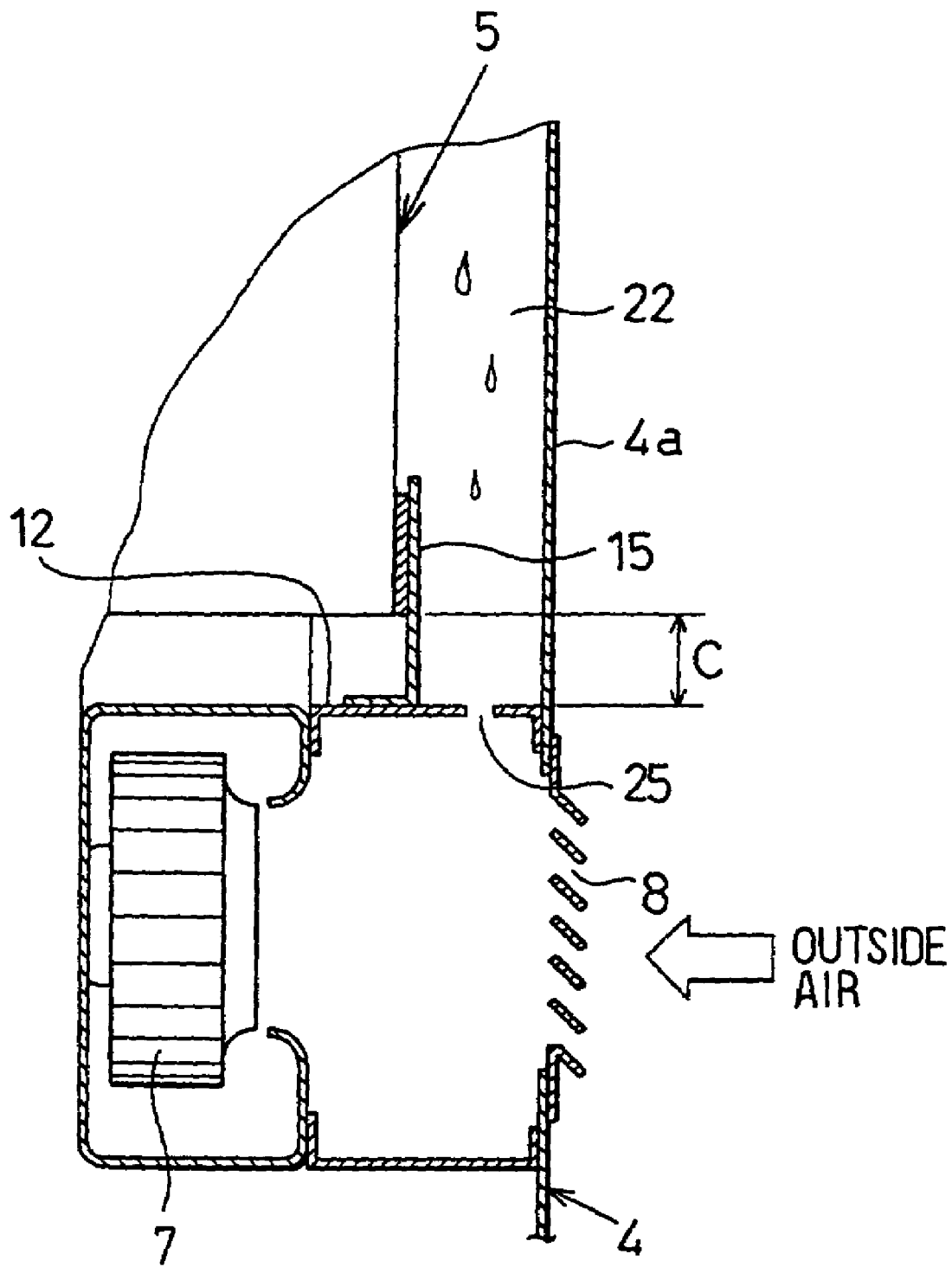
FIG. 5 is a side view showing a part of a cooling device when a clearance is provided at a lower side of the heat exchanger, according to a modification of the first embodiment.
Figure 6:
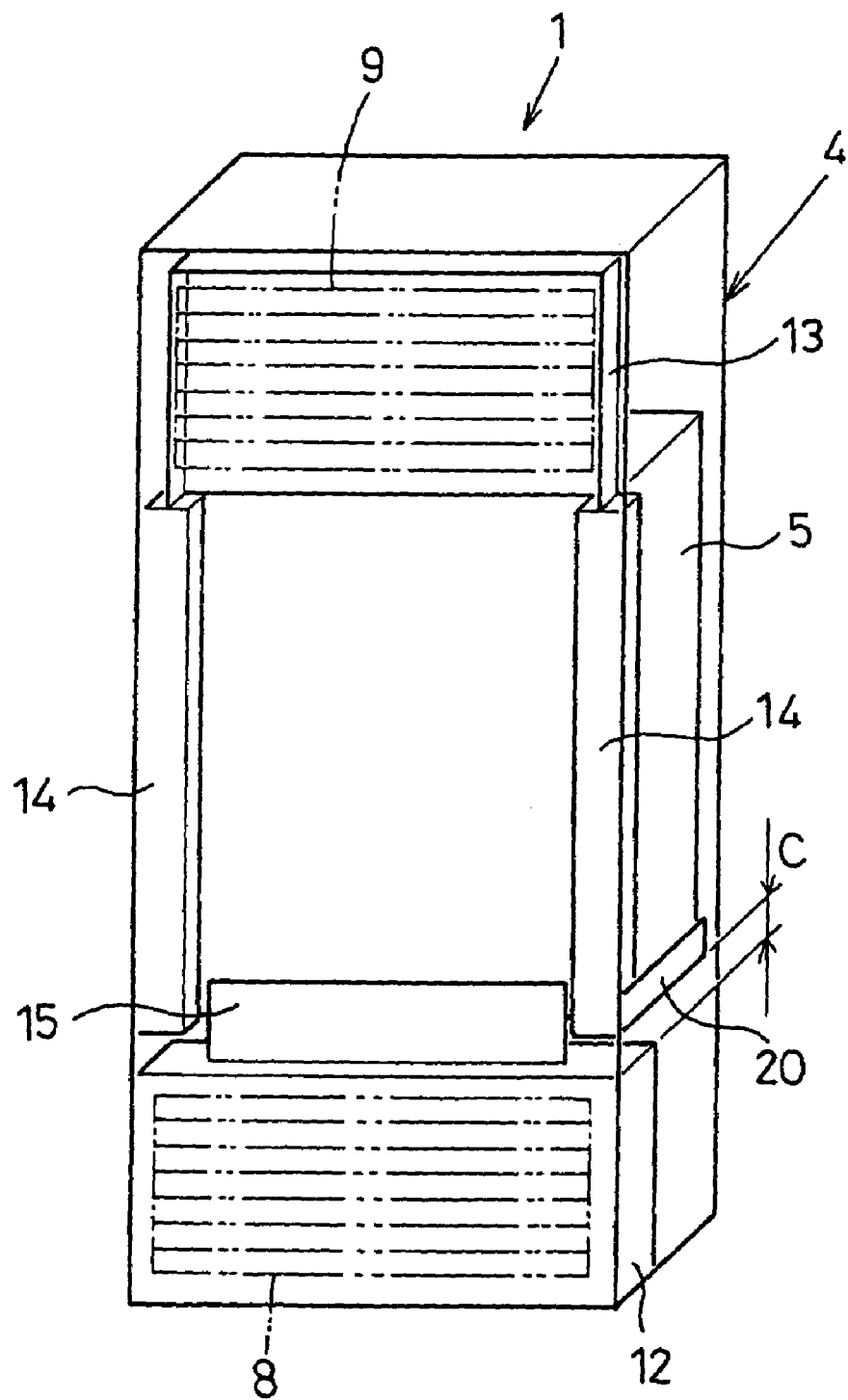
FIG. 6 is a perspective view showing the cooling device according to the modification of the first embodiment.

In the above-described first embodiment, the heat exchange 5 is held on the upper surface of the bracket 12 through the stay 20 and the like. However, as shown in FIGS. 5 and 6, a clearance C may be provided under the heat exchanger 5 between the heat exchanger 5 and the bracket 12. In this case, rain water flowing into the drain space 22 can be readily discharged to an outside through the clearance C from the drain port 25 provided at the lower side of the drain space 22. Therefore, drain performance of rain water can be further improved, and an introduction of rain water from the drain space 22 into the heat exchanger 5 can be accurately prevented.

Figure 7:
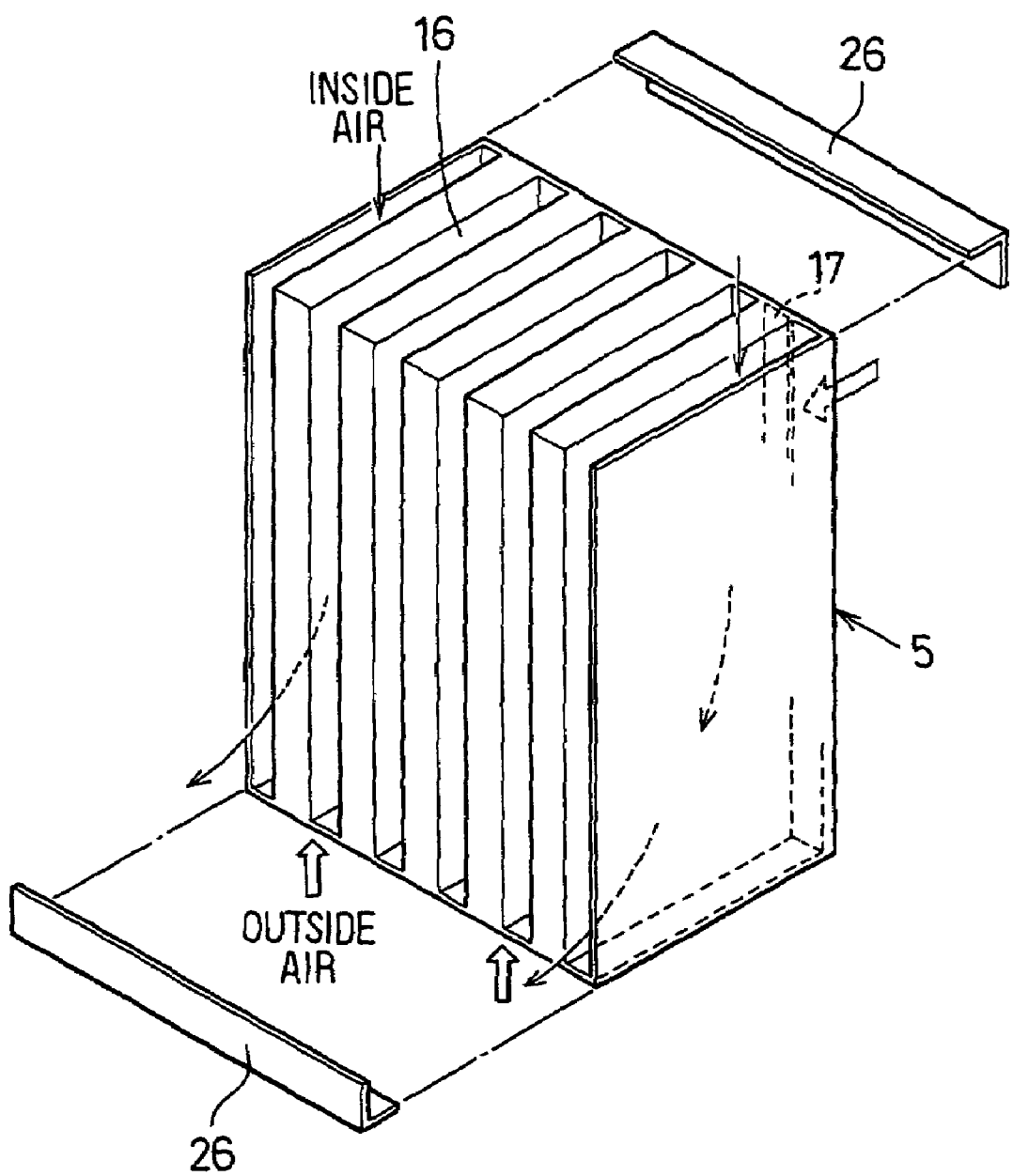
FIG. 7 is a perspective view showing a heat exchanger and a L-shaped member according to a second preferred embodiment of the present invention.
Figure 8A:
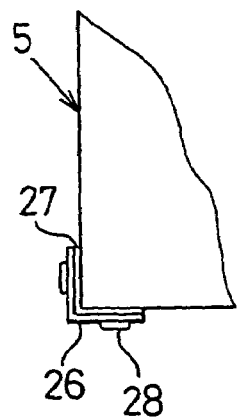
FIGS. 8A, 8B and 8C are view showing attachment examples of the L-shaped member attached to the heat exchanger according to the second embodiment.
Figure 8B:
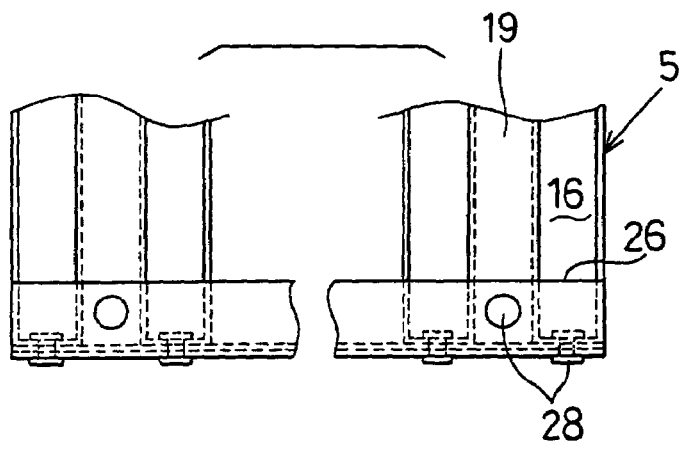
Figure 8C:
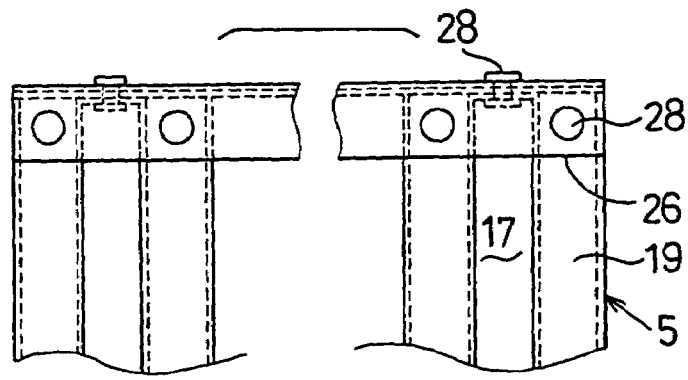

A second preferred embodiment of the present invention will be described with reference to FIGS. 7–8C. In the second embodiment, as shown in FIG. 7, L-shaped members 26 each having a L-shaped cross section are disposed at the boundary angle parts between the inside air side and the outside air side of the heat exchanger 5, respectively. Specifically, the L-shaped members 26 are provided at the boundary angle part where an inlet opening surface of the inside air passages 16 and an outlet opening surface of the outside air passages 17 are crossed, and at the boundary angle part where an outlet opening surface of the inside air passages 16 and an inlet opening surface of the outside air passages 17 are crossed. Further, the packing 21 (see FIG. 4) is disposed to be inserted between the L-shaped member 26 and the flat surface of the casing 4, so that the waterproof performance is improved.

Here, on the inlet opening surface of the inside air passages 16, the plural inlet openings of the inside air passages 16 are opened. On the outlet opening surface of the inside air passages 16, the plural outlet openings of the inside air passages 16 are opened. Similarly, on the inlet opening surface of the outside air passages 17, the plural inlet openings of the outside air passages 17 are opened. On the outlet opening surface of the outside air passages 17, the plural outlet openings of the outside air passages 17 are opened.

The L-shaped member 26 can be bonded to the boundary angle part of the heat exchanger 5 by applying potting material onto an inner side of the L-shaped member 26, or can be integrally bonded to the boundary angle part of the heat exchanger 5 by brazing. Alternatively, as shown in FIG. 8A, a packing 27 can be inserted between the L-shaped member 26 and the heat exchanger 5, and the packing 27 and the L-shaped member 26 can be fixed to the heat exchanger 5 by waterproof rivets 28. As shown in FIGS. 8B and 8C, the rivets 28 can be attached to flat rear surfaces of the plates 19, defining the inside air passages 16 or the outside air passages 17. In the above-described second embodiment, as shown in FIG. 7, both the L-shaped members 26 are provided at the upper boundary angle part and the lower boundary angle part of the heat exchanger 5, respectively. However, the L-shaped member 26 can be attached to only any one of the upper boundary angle part and the lower boundary angle part of the heat exchanger 5. Even in this case, waterproof performance in the cooling device 1 can be improved.

Figure 9:
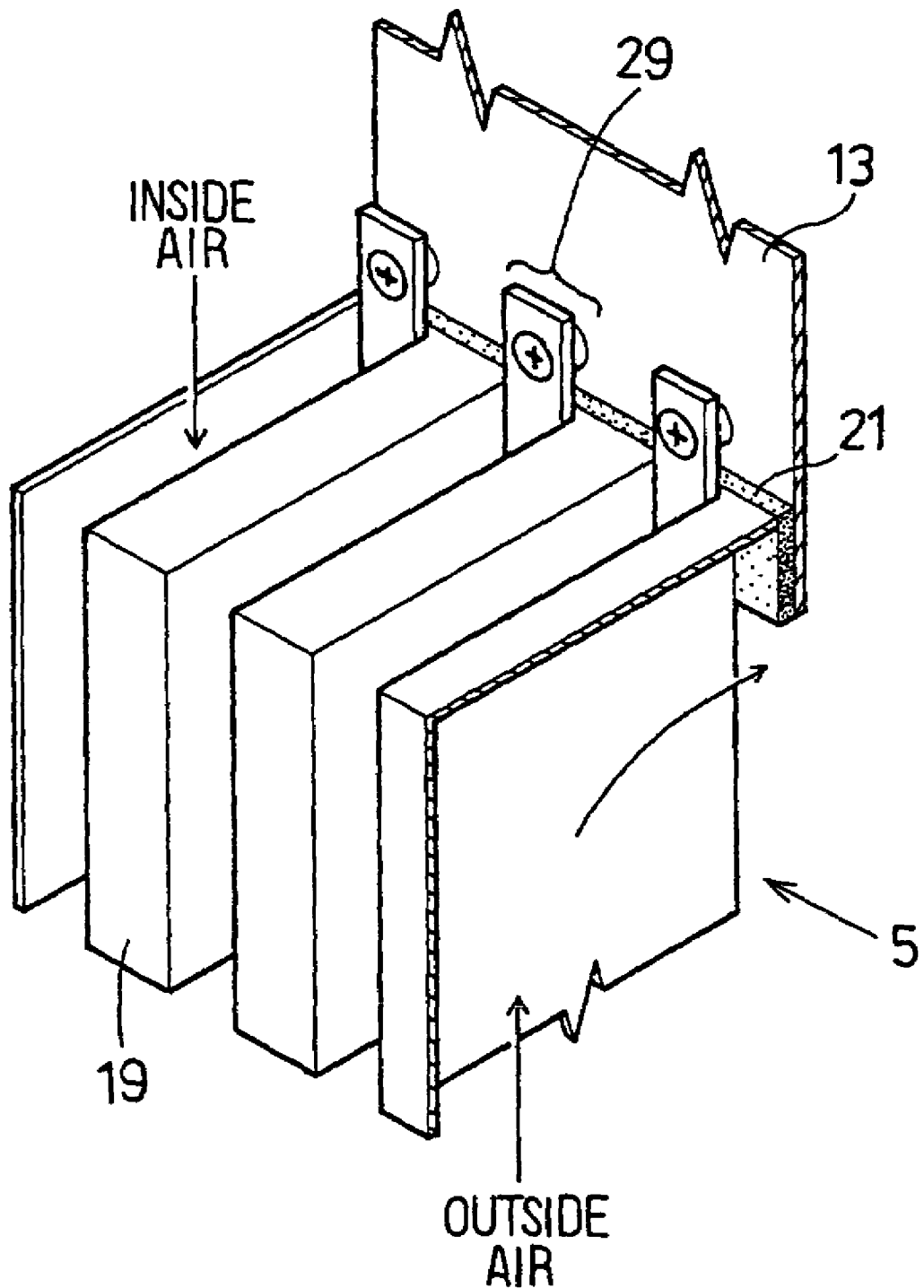
FIG. 9 is a perspective view showing an attachment structure of a heat exchanger with a fitting member according to a third preferred embodiment of the present invention.
Figure 10A:
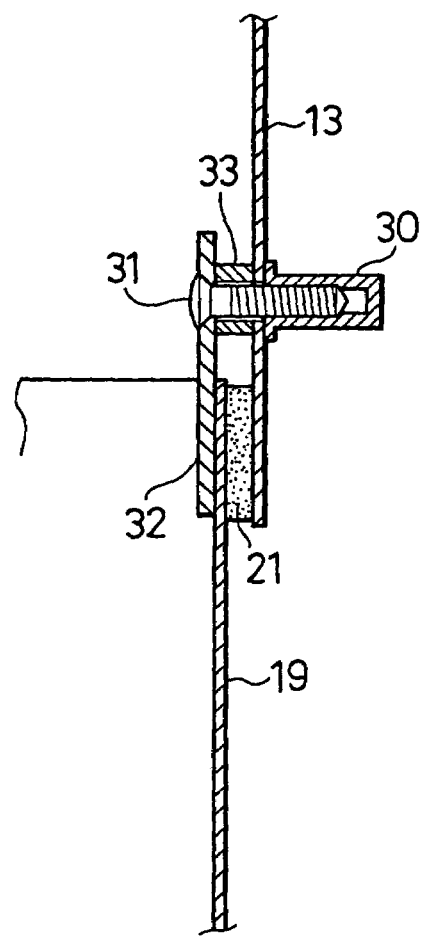
FIGS. 10A and 10B are sectional views showing the fitting member according to the third embodiment.
Figure 10B:
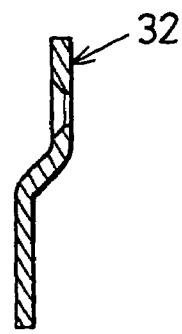

A third embodiment of the present invention will be now described with reference to FIGS. 9–10B. In the third embodiment, an attachment structure of the heat exchanger 5 is mainly described. As shown in FIG. 9, the rear surfaces of the plates 19 defining the inside air passages 16 or the outside air passages 17 are fixed to an inner wall surface of the casing 4 (e.g., partition wall 13) by a fitting member 29, so that a waterproof structure is formed. The fitting member 29 can be formed as shown in FIG. 10A, for example. As shown in FIG. 10A, the fitting member 29 includes a seal nut 30 disposed on an outer wall surface of the casing 4, a screw 31 disposed to be screwed into the seal nut 30, a fastening plate 32 through which a fastening force of the screw 31 is applied to a seal part (e.g., packing 21), and a bush 33 disposed between the fastening plate 32 and the casing 4. By setting a thickness of the bush 33, a fastening degree of the packing 21 can be controlled. Further, when the fastening plate 32 is formed into a step shape shown in FIG. 10B, the bush 33 can be omitted. According to the third embodiment, by the fitting member 29, the waterproof performance can be improved.

Figure 11:
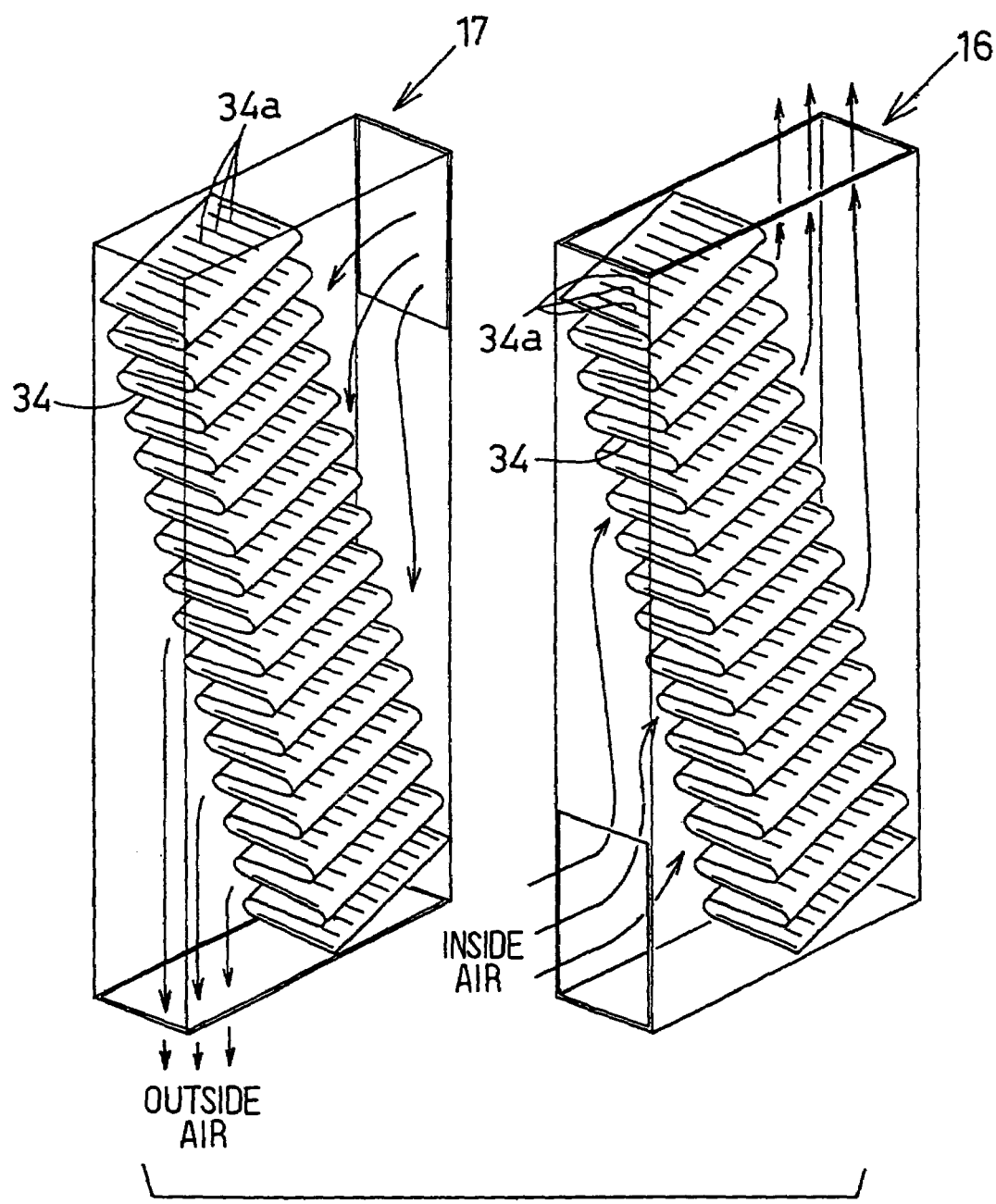
FIG. 11 is a perspective view showing fins disposed within an inside air passage and an outside air passage of a heat exchanger according to a fourth preferred embodiment of the present invention.

A fourth preferred embodiment of the present invention will be now described with reference to FIG. 11. In the fourth embodiment, fins 34 are disposed in the inside air passage 16 and the outside air passage 17 of the heat exchanger 5, respectively. Plural louvers 34a are provided on the surfaces of the fins 34. By providing the fins 34 in the inside air passage 16 and the outside air passage 17, heat transmitting area of air can be increased. In FIG. 11, the fins 34 are respectively tilted within the inside air passage 16 and the outside air passage 17 so that air-flowing direction within each air passage 16, 17 is not greatly changed. However, the fins 34 may be provided within the air passages 16, 17, with the other arrangements. In FIG. 11, the inside air passage 16 and the outside air passage 17 are separately indicated. However, actually, Plural inside air passages 16 and plural outside air passages 17 are alternately adjacently arranged similarly to the above-described first embodiment. Further, in the fourth embodiment, the attachment structure and the seal structure of the heat exchanger 5 relative to the casing 4 are similar to those of the above-described first embodiment.

Although the present invention has been fully described in connection with preferred embodiments thereof with reference to the accompanying drawings, it is to be noted that various changes and modifications will become apparent to those skilled in the art.

In the above-described embodiments, the present invention is typically applied to the cooling device 1 for cooling the inner part of the box 3. However, the present invention may be applied to a heat-exchanging device for controlling the temperature of the inner part of the box 3. In this case, the heat-exchanging device can heat the inner space of the box 3, for example.

In the above-described first embodiment, the inside air fan 6 is disposed at an upper side of the heat exchanger 5 so that inside air flows through the inside air passages 16 downwardly, and the outside air fan 7 is disposed at a lower side of the heat exchanger 5 so that outside air flows through the outside air passages 17 upwardly. However, the cooling device 1 shown in FIG. 1 may be reversely disposed in the up-down direction.

Such changes and modifications are to be understood as being within the scope of the present invention as defined by the appended claims.

The invention claimed is:

1. A heat-exchanging device being attached to a box to form an approximately sealed inner space within the box, said heat-exchanging device comprising:

a heat exchanger having therein a plurality of inside air passages extending substantially in a vertical direction through which inside air inside the box flows, and a plurality of outside air passages extending substantially in the vertical direction through which outside air outside the box flows, said inside air passages and said outside air passages are alternately adjacently arranged;

a casing for accommodating said heat exchanger, said casing having an outer wall surface in which an outside air introduction port for introducing outside air into said outside air passages and an outside air discharging port for discharging outside air from said outside air passage are provided, and a seal member through which a boundary part between said inside air passages and said outside air passages of said heat exchanger is tightly attached to an attachment wall surface of said casing; wherein:

said heat exchanger is disposed in said casing to form a space having a predetermined distance greater than zero between the heat exchanger and said outer wall surface, said space extending substantially in the vertical direction along approximately an entire length of said heat exchanger in the vertical direction;

said outside air passages are provided to communicate with said outside air discharge port through said space;

said heat exchanger includes a plate member having plural wall parts each of which is disposed opposite to said outer wall surface of said casing to define said inside air passages;

said outside air passages are opened in said plate member to communicate with said space;

said inside air passages and said outside air passages are provided in such a manner that both the outermost air passages of said heat exchanger are two of said inside air passages; and said wall parts defining the outermost inside air passages have flat attachment surfaces which are attached to said attachment wall surface of said casing through said seal member.

2. The heat-exchanging device according to claim 1, wherein:

said casing has a drain passage communicating with said space; and said drain passage is provided at a position lower than a bottom surface of said heat exchanger.

3. The heat-exchanging device according to claim 1, wherein:

said heat exchanger has a plate member defining said inside air passages of said heat exchanger; and said plate member of said heat exchanger is disposed to be fastened to an attachment wall surface of said casing by using a fastening member at a position defining said inside air passages.

4. The heat-exchanging device according to claim 1, wherein:

said heat exchanger includes a first side plate disposed to form said space with said outer wall surface of said casing, said first side plate having outside air outlet openings through which outside air from said outside air passages flows into said space, and a second side plate disposed opposite to said first plate, said second side plate having inside air outlet openings through which inside air from said inside air passages flows into the inner space of the box.

5. The heat-exchanging device according to claim 4, wherein:

said heat exchanger further includes a bottom surface having outside air inlet openings from which outside air is introduced into said outside air passages.

6. The heat-exchanging device according to claim 4, wherein:

said heat exchanger further includes a top surface having inside air inlet openings from which inside air is introduced into said inside air passages, and a bottom surface having outside air inlet openings from which outside air is introduced into said outside air passages.

7. The heat-exchanging device according to claim 1, wherein:

said outer wall surface extends in the vertical direction;

said outside air introduction port and said outside air discharge port are provided in the outer wall surface at two sides of the heat exchanger in the vertical direction.

8. The heat-exchanging device according to claim 7, wherein:

said outside air introduction port is provided at a lower side of the heat exchanger, and outside air discharge port is provided at an upper side of the heat exchanger, and the space extends vertically at least from a bottom end of the heat exchanger to a top end of said outside air discharge port.

9. The heat-exchanging device according to claim 1, wherein:

the predetermined distance between said heat exchanger and said outer wall surface is approximately constant in the entire length of said heat exchanger.

* * * * *